United States Patent
Murrin et al.

(10) Patent No.: US 10,296,456 B2
(45) Date of Patent: May 21, 2019

(54) TILE BASED INTERLEAVING AND DE-INTERLEAVING FOR DIGITAL SIGNAL PROCESSING

(71) Applicant: Imagination Technologies Limited, Kings Langley (GB)

(72) Inventors: Paul Murrin, Chepstow (GB); Adrian J. Anderson, Chepstow (GB); Mohammed El-Hajjar, Southampton (GB)

(73) Assignee: Imagination Technologies Limited, Kings Langley (GB)

( * ) Notice: Subject to any disclaimer, the term of this patent is extended or adjusted under 35 U.S.C. 154(b) by 912 days.

(21) Appl. No.: 13/794,796

(22) Filed: Mar. 12, 2013

(65) Prior Publication Data

US 2014/0068168 A1 Mar. 6, 2014

(30) Foreign Application Priority Data

Aug. 30, 2012 (GB) .................................. 1215425.8

(51) Int. Cl.
*G06F 12/06* (2006.01)
*H03M 13/27* (2006.01)
*H03M 13/00* (2006.01)

(52) U.S. Cl.
CPC ...... *G06F 12/0607* (2013.01); *H03M 13/276* (2013.01); *H03M 13/2707* (2013.01); *H03M 13/6505* (2013.01)

(58) Field of Classification Search
CPC .................. G06F 12/0607; G06F 12/0207; H03M 13/27; H03M 13/276; H03M 13/2792
See application file for complete search history.

(56) References Cited

U.S. PATENT DOCUMENTS

| 7,793,191 B2 | 9/2010 | Takamura |
| 2003/0225958 A1 | 12/2003 | Efland et al. |

(Continued)

FOREIGN PATENT DOCUMENTS

| CN | 1713678 A | 12/2005 |
| CN | 101237240 A | 8/2008 |

OTHER PUBLICATIONS

Samsung Electronics, 128Mb K-die SDRAM Specification, Mar. 2009, Rev. 1.23.*

(Continued)

*Primary Examiner* — Reginald G Bragdon
*Assistant Examiner* — Thanh D Vo
(74) *Attorney, Agent, or Firm* — Vorys, Sater, Seymour and Pease LLP; Vincent M DeLuca

(57) ABSTRACT

Tile based interleaving and de-interleaving of row-column interleaved data is described. In one example, the de-interleaving is divided into two memory transfer stages, the first from an on-chip memory to a DRAM and the second from the DRAM to an on-chip memory. Each stage operates on part of a row-column interleaved block of data and re-orders the data items, such that the output of the second stage comprises de-interleaved data. In the first stage, data items are read from the on-chip memory according to a non-linear sequence of memory read addresses and written to the DRAM. In the second stage, data items are read from the DRAM according to bursts of linear address sequences which make efficient use of the DRAM interface and written back to on-chip memory according to a non-linear sequence of memory write addresses.

20 Claims, 10 Drawing Sheets

(56) References Cited

U.S. PATENT DOCUMENTS

| | | | |
|---|---|---|---|
| 2005/0063421 A1* | 3/2005 | Wan | H03M 13/23 370/509 |
| 2006/0236045 A1 | 10/2006 | Keyes | |
| 2007/0266187 A1 | 11/2007 | Senoo | |
| 2008/0028188 A1 | 1/2008 | Zhong | |
| 2008/0152131 A1 | 6/2008 | Senoo | |
| 2009/0235020 A1* | 9/2009 | Srinivasan et al. | 711/106 |
| 2009/0313399 A1 | 12/2009 | Lingam et al. | |
| 2011/0113305 A1 | 5/2011 | Liu et al. | |

OTHER PUBLICATIONS

Combined Search & Exam Report in GB1215422.5 (dated Dec. 19, 2012).

Combined Search & Exam Report in GB1215425.8 (dated Dec. 20, 2012).

* cited by examiner

| | | | | |
|---|---|---|---|---|
| 0' | 40' | 80' | 120' | 160' |
| 1' | 41' | 81' | 121' | 161' |
| 2' | 42' | 82' | 122' | 162' |
| 3' | 43' | 83' | 123' | 163' |
| 4' | 44' | 84' | 124' | 164' |
| 5' | 45' | 85' | 125' | 165' |
| 6' | 46' | 86' | 126' | 166' |
| 7' | 47' | 87' | 127' | 167' |
| 8' | 48' | 88' | 128' | 168' |
| 9' | 49' | 89' | 129' | 169' |
| 10' | 50' | 90' | 130' | 170' |
| 11' | 51' | 91' | 131' | 171' |
| ... | ... | ... | ... | ... |
| 16' | 56' | 96' | 136' | 176' |
| 17' | 57' | 97' | 137' | 177' |
| 18' | 58' | 98' | 138' | 178' |
| 19' | 59' | 99' | 139' | 179' |
| 20' | 60' | 100' | 140' | 180' |
| 21' | 61' | 101' | 141' | 181' |
| 22' | 62' | 102' | 142' | 182' |
| ... | ... | ... | ... | ... |
| 39' | 79' | 119' | 159' | 199' |

902

| | | | | |
|---|---|---|---|---|
| 0 | 40 | 80 | 120 | 160 |
| 10 | 50 | 90 | 130 | 170 |
| 20 | 60 | 100 | 140 | 180 |
| 30 | 70 | 110 | 150 | 190 |
| 1 | 41 | 81 | 121 | 161 |
| 11 | 51 | 91 | 131 | 171 |
| 21 | 61 | 101 | 141 | 181 |
| 31 | 71 | 111 | 151 | 191 |
| 2 | 41 | 82 | 122 | 162 |
| 12 | 52 | 92 | 132 | 172 |
| 22 | 62 | 102 | 142 | 182 |
| 32 | 72 | 112 | 152 | 192 |
| ... | ... | ... | ... | ... |
| 4 | 44 | 84 | 124 | 164 |
| 14 | 54 | 94 | 134 | 174 |
| 24 | 64 | 104 | 144 | 184 |
| 34 | 74 | 114 | 154 | 194 |
| 5 | 45 | 85 | 125 | 165 |
| 15 | 55 | 95 | 135 | 175 |
| 25 | 65 | 105 | 145 | 185 |
| ... | ... | ... | ... | ... |
| 39 | 79 | 119 | 159 | 199 |

TILE BASED INTERLEAVING AND DE-INTERLEAVING FOR DIGITAL SIGNAL PROCESSING

BACKGROUND

Digital signal processing is used in a wide variety of applications. Many of these applications are real-time in the sense that time constraints exist on the processing of the data in order for it to be meaningful or useful to an end user. An example of this is digital broadcast streams, such as digital television and digital radio. The digital signal processing system needs to be capable of processing and decoding the real-time streams rapidly enough to enable the data to be output as quickly as it is received (barring buffering).

Digital signal processing systems often utilise one or more dedicated hardware peripherals in addition to more general-purpose digital signal processors. The hardware peripherals are processing blocks that are designed to perform a specific signal processing task in a rapid and efficient manner. For example, interleaving and de-interleaving is an operation that is commonly performed for real-time data using a hardware peripheral. Interleaving and de-interleaving are memory-intensive operations, and the hardware peripherals that perform this utilise an associated dedicated memory device for re-ordering the data.

However, the requirements of different types of real-time data can vary significantly. For example, the various different digital television and radio standards used around the world often have the real-time data structured differently, e.g. using different types or parameters for coding, interleaving, equalisation etc. If the digital signal processing system is to be flexible enough to be used with different standards, then the dedicated memory device used for interleaving/de-interleaving must be sufficiently large to handle the standard with the largest memory demands. As a result, the memory used with an interleaving/de-interleaving hardware peripheral is frequently underutilised.

An example of a memory device is a DRAM (Dynamic Random Access Memory) device. DRAM devices organise their stored content in pages, each typically a few thousand bytes in size. Each DRAM can only have a limited number of pages open at one time (typically four) and many overhead cycles are needed to open a page to access data.

The embodiments described below are not limited to implementations which solve any or all of the disadvantages of known digital signal processing systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Tile based interleaving and de-interleaving of row-column interleaved data is described. In one example, the de-interleaving is divided into two memory transfer stages, the first from an on-chip memory to a DRAM and the second from the DRAM to an on-chip memory. Each stage operates on part of a row-column interleaved block of data and re-orders the data items, such that the output of the second stage comprises de-interleaved data. In the first stage, data items are read from the on-chip memory according to a non-linear sequence of memory read addresses and written to the DRAM. In the second stage, data items are read from the DRAM according to bursts of linear address sequences which make efficient use of the DRAM interface and written back to on-chip memory according to a non-linear sequence of memory write addresses.

A first aspect provides a digital signal processing system-on-chip, comprising: a first memory storing a plurality of data items arranged in a first sequence, each data item having an associated memory address on the first memory and the plurality of data items comprising a subset of a block of data items; a second memory; and a transfer engine coupled to the first memory and the second memory and comprising a port to a dynamic random access memory, DRAM, wherein the transfer engine is configured to transfer the plurality of data items directly from the first memory to the DRAM in a first memory transfer stage and to transfer the plurality of data items directly from the DRAM to the second memory in a second memory transfer stage, and wherein in the first memory transfer stage, the transfer engine is arranged to read the plurality of data items from the first memory according to a predefined non-linear sequence of memory read addresses and to write the plurality of data items to the DRAM, and wherein in the second memory transfer stage, the transfer engine is arranged to read the plurality of data items from the DRAM according to bursts of linear address sequences, each burst of linear address sequences having a length selected based on a DRAM interface burst size, and to write the plurality of data items to the second memory according to a predefined non-linear sequence of memory write addresses, such that the plurality of data items are arranged in a second sequence on the second memory that is different from the first sequence and wherein one of the first sequence and the second sequence comprises row-column interleaved data.

A second aspect provides a method of performing an interleaving or de-interleaving operation on a block of data items in a digital signal processing system, the method comprising: reading, from a first on-chip memory, a first plurality of data items stored in a first sequence according to a predefined non-linear sequence of memory read addresses, wherein the first plurality of data items comprises a subset of the block of data items; writing the first plurality of data items to a dynamic random access memory, DRAM; reading, from the DRAM, the first plurality of data items according to bursts of linear address sequences, each burst of linear address sequences having a length selected based on a DRAM interface burst size; and writing the first plurality of data items to a second on-chip memory according to a predefined non-linear sequence of memory write addresses, such that the data items are arranged in a second sequence on the second on-chip memory that is different from the first sequence and wherein one of the first sequence and the second sequence comprises row-column interleaved data.

A third aspect provides a computer program comprising computer program code means adapted to perform all the steps of the any of the methods described above when said program is run on a computer. The computer program may be embodied on a computer readable medium.

A fourth aspect provides a method of performing an interleaving or de-interleaving operation substantially as described with reference to any of FIGS. 5-10 of the drawings.

The methods described herein may be performed by a computer configured with software in machine readable form stored on a tangible storage medium e.g. in the form of a computer program comprising computer program code for configuring a computer to perform the constituent portions of described methods. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

This acknowledges that firmware and software can be valuable, separately tradable commodities. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The above features may be combined as appropriate, as would be apparent to a skilled person, and may be combined with any of the aspects of the examples.

BRIEF DESCRIPTION OF THE DRAWINGS

Embodiments will be described, by way of example, with reference to the following drawings, in which:

FIG. 7 shows an example time interleaved block of data;

FIG. 9 shows a grid representation of the data items stored in the DRAM at the end of the first stage of the method of FIG. 8 for an input interleaved block as shown in FIG. 7; and FIG. 10 shows a grid representation of the data items stored in the on-chip memory at the end of the second stage of the method of FIG. 8 for an input interleaved block as shown in FIG. 7.

Figure 1:
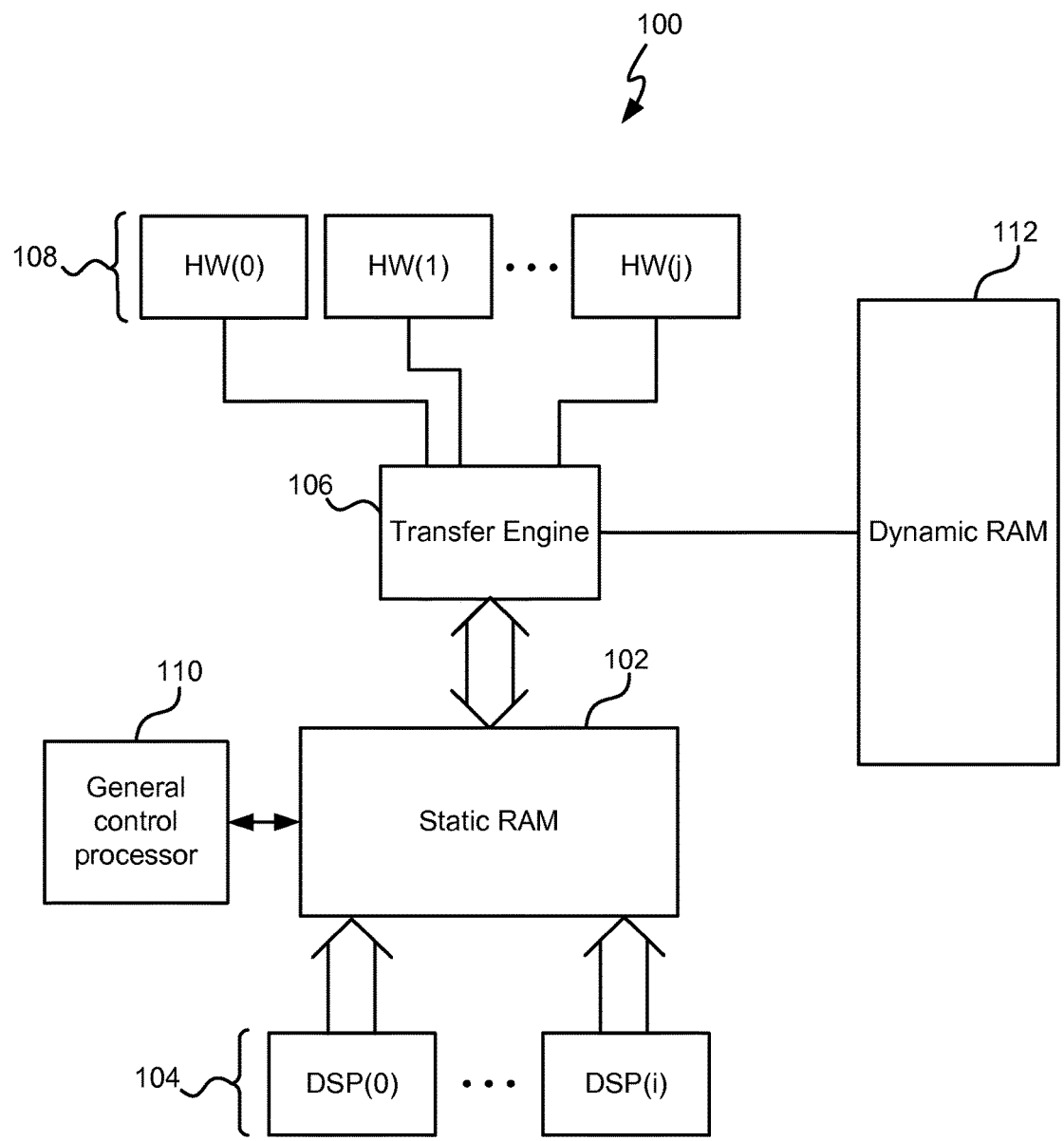
FIG. 1 illustrates a digital signal processing system.

Common reference numerals are used throughout the figures to indicate similar features.

DETAILED DESCRIPTION

Embodiments are described below by way of example only. These examples represent the best ways of putting the embodiments into practice that are currently known to the Applicant although they are not the only ways in which this could be achieved. The description sets forth the functions of the example and the sequence of steps for constructing and operating the example. However, the same or equivalent functions and sequences may be accomplished by different examples.

Described below is a digital signal processing system that makes use of both general purpose digital signal processors (DSPs) as well as specialised hardware peripherals. In order to enable efficient use of memory, the different elements of the system have access to a shared on-chip memory. Data items can be written to or read from the on-chip memory by a transfer engine, such as a direct memory access (DMA) controller. The on-chip memory comprises Static Random Access Memory (SRAM) and the transfer engine also has a port to a Dynamic RAM (DRAM), which may be external or on-chip. The transfer engine has an address generating element which enables different sequences of data items to be read from and/or written to the memory, and such sequences may comprise linear and non-linear sequences of data items.

The term 'linear' is used herein in relation to reading/writing sequences of data items, to refer to reading/writing consecutive (or contiguous) data items. In contrast, the term 'non-linear' is used herein in relation to reading/writing sequences of data items, to refer to reading/writing non-consecutive (or non-contiguous) data items and examples of non-linear sequences are described below.

Any use of DRAM in the following description is intended to cover any form of DRAM, including synchronous DRAM, double data rate (DDR) DRAM (which may be referred to as DDR RAM) and burst access DRAM. As described above, DRAM devices organise their stored content in pages and can only have a limited number of pages open at one time. When accessing a DRAM of any type, patterns of data access that frequently access different pages can be inefficient because it takes many overhead cycles to open a page. In burst access DRAM, the DRAM interface reads/writes bursts of 4, 8, 16, 32 or 64 (or more) consecutive bytes. Access patterns which use incomplete DRAM interface bursts are also inefficient.

The ability to read/write different sequences of data items enables re-ordering operations, such as interleaving or de-interleaving, to be performed on the data items on-the-fly, whilst the data items are being transferred between memory locations or from one memory to another (e.g. between the SRAM and the DRAM). This avoids the need for a dedicated (non-shared) memory to be included on the digital signal processing system for use with interleaving or de-interleaving, which in turn reduces chip area and cost. The different sequences used may be arranged to counteract the performance limitations of certain types of memory devices, such as DRAM (which is cheaper to use than SRAM in terms of area and hence cost and so larger DRAMs may be used), as is described in more detail below.

In the following description, time interleaving/de-interleaving is used by way of example only; however it will be appreciated that the methods are also applicable to other forms of interleaving/de-interleaving, such as bit interleaving/de-interleaving.

Reference is first made to FIG. 1, which shows the structure of an example digital signal processing system-on-chip 100. The system 100 comprises an on-chip memory 102 and a DRAM 112 connected to a transfer engine 106. Both of the memory devices 102, 112 are used for the storage of data items and they may both provide shared memory spaces (e.g. storing data relating to the digital signal processing system, as well as MPEG or other video stream-related data). The on-chip memory 102 can be any suitable form of RAM, such as (but not limited to) SRAM, but not DRAM. The DRAM 112 may be on-chip or external to the chip (in the sense that it is not directly accessible by the DSPs 104) and in the following description, the term 'on-chip' memory is used to refer to on-chip memory 102 which is a non-DRAM memory element, despite the fact that the DRAM 112 may also be on-chip memory (i.e. an integral part of the system-on-chip 100 as it is formed on the same piece of silicon).

Connected to the on-chip memory 102 are one or more DSPs 104. The DSPs 104 are processors that are programmable to perform signal processing calculations on data, such as, for example, fast fourier transforms and equalisation. Whilst not considered general-purpose processors, the DSPs 104 are more configurable than the hardware peripherals described below. The DSPs 104 execute program code/instructions to read data from the on-chip memory 102, perform signal processing operations on the data, and write data back to the on-chip memory 102.

Also connected to the on-chip memory 102 is the transfer engine 106, which provides access to the on-chip memory 102 for a plurality of hardware (HW) peripherals 108. In some examples, the transfer engine 106 can be in the form of a direct memory access (DMA) controller. The transfer engine 106 provides a plurality of memory access channels (e.g. DMA channels) that can be used by the hardware peripherals 108 to enable the reading or writing of data from or to the on-chip memory 102.

As noted above, the hardware peripherals 108 are specialised, dedicated fixed-function hardware blocks that are configured to perform a particular signal processing task. For example, one hardware peripheral may be a specialised Viterbi decoding block, and another one may be a specialised Reed-Solomon decoding block. The hardware peripherals may also be known as accelerators. Each of the hardware peripherals operates independently of each other. The hardware peripherals may be sufficiently configurable to be provided with operational parameters specific to their task, but they are not sufficiently configurable to change their task (e.g. a Viterbi block cannot be reconfigured as a Reed-Solomon block).

Therefore, the hardware peripherals are more specialised to a particular task than the DSPs 104. However, the hardware peripherals are arranged to perform their specialised tasks in a very rapid and efficient manner. Also connected to the on-chip memory 102 is a general control processor 110, which can be used to initialise, configure and control the operation of the digital signal processing system.

The digital signal processing system described above provides flexibility in the signal processing operations. For example, the system can be arranged to operate such that the different DSPs 104 and hardware peripherals 108 process the data in any desired configuration or sequence. Each hardware peripheral or DSP can operate on one or more blocks of data (also referred to herein as buffers of data) provided by other parts of the system and stored in the on-chip memory 102, and generates and stores one or more buffers of data to be used by other elements of the system. This enables the digital signal processing system to be used for a variety of different types of signal, e.g. for different broadcast/telecommunication standards.

The use of a common memory space provided by the on-chip memory 102 enables the total amount of memory storage provisioned in the system-on-chip 100 to be reduced. Without the use of a common memory space, each processing element is provided with its own, dedicated memory. For example, each of the DSPs 104 may have their own workspace memory, the general control processor 110 has another separate memory for storing execution code and data, the hardware peripherals 108 have separate input and output buffers, and one or more additional memories may be used for exchanging data between the processing elements.

Because the digital signal processing system is configurable in order to allow different communication standards to be implemented, each of these separate memories need to be separately dimensioned for the particular standard that has the largest demand on any given memory. In other words, the DSP memory needs to be large enough to accommodate the standard that has the largest demands on DSP memory. Similarly, the hardware peripheral buffers need to be large enough to accommodate the standard with the highest demands on hardware peripheral buffers (which may be different to the standard with high DSP memory demands). As a result of this, significant amounts of memory are generally unused by some of the processing elements.

However, if a common memory space is provided by the on-chip memory 102, then the memory requirements of the different standards as a whole can be taken into account (rather than their requirements on individual elements of the system). In other words, the on-chip memory 102 needs to be large enough to accommodate the largest overall, total memory demands of the standards. This has the effect of averaging the differing memory requirements between the standards (e.g. one standard might need more DSP memory, but smaller buffers, whereas another standard may be the opposite). This has the effect of requiring a significantly lower amount of overall memory, and hence saves silicon area.

The common memory space provided by the on-chip memory 102 can therefore hold all the different types of data used by the system, such as digital signal processor workspaces, execution code and data for the general control processor, input and output buffers for one or more of the hardware peripherals, one or more buffers for exchanging data between processors, as well as other configuration data for the digital signal processing system.

Figure 2:
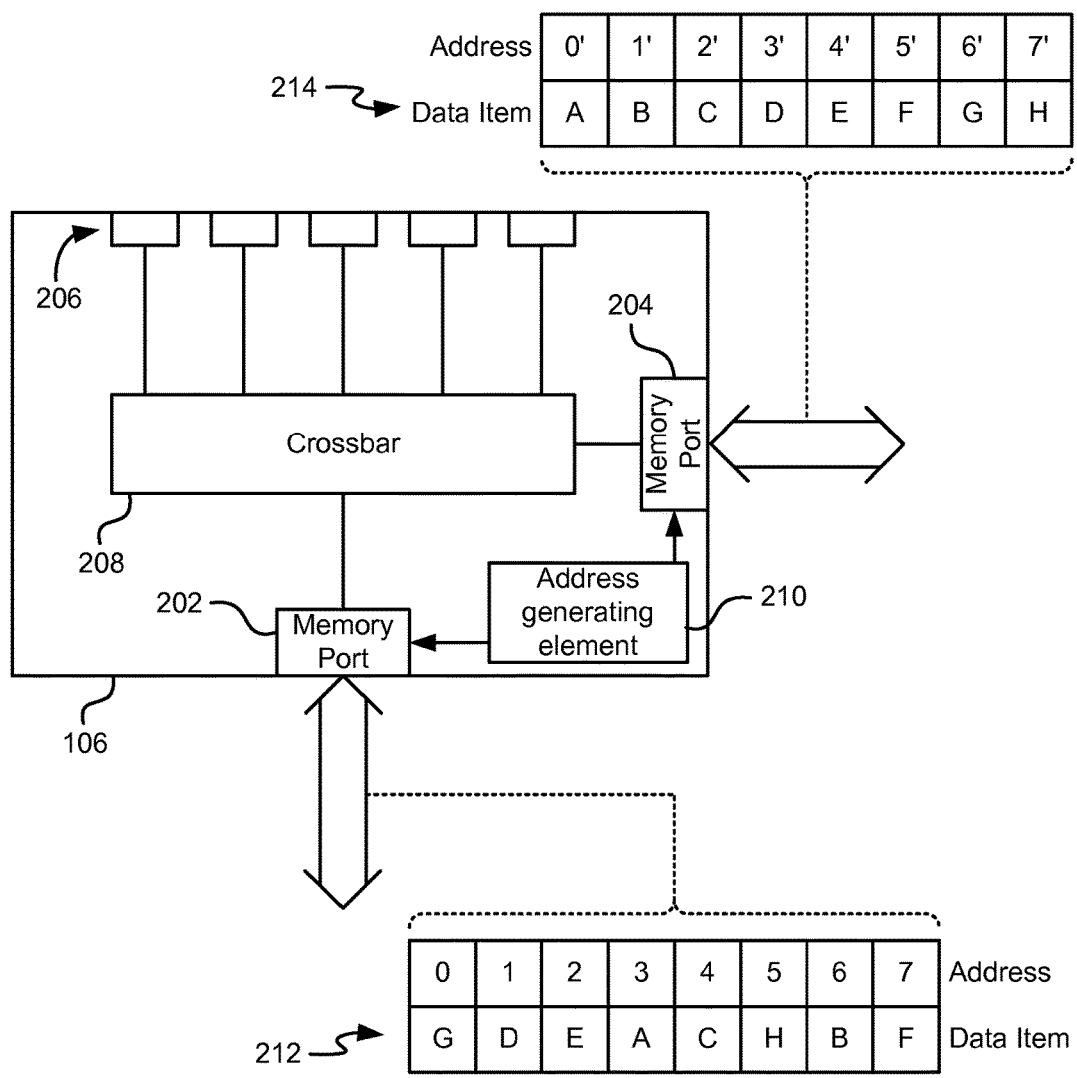
FIG. 2 illustrates a schematic diagram of a transfer engine.

Reference is now made to FIG. 2, which illustrates a schematic diagram of the transfer engine 106. The transfer engine 106 comprises a first memory port 202, which is arranged to connect to the on-chip memory 102, and a second memory port 204 which is arranged to connect to the DRAM 112. The transfer engine 106 also comprises a plurality of peripheral ports 206, each arranged to connect to an associated hardware peripheral 108. The memory ports 202, 204 and peripheral ports 206 are all connected to a crossbar 208, which enables any one of these ports to be connected to any other of these ports.

The transfer engine 106 further comprises an address generating element 210, which is coupled to both the memory ports 202, 204 and is arranged to generate sequences of read and/or write addresses for either or both of the memories connected to the memory ports 202, 204. In some examples, the address generating element 210 may comprise a configurable address generator which may be programmed to operate in a number of different modes (e.g. linear and non-linear modes) and which may be configured to select one or modes of operation from a set of possible modes. In other examples, the address generating element 210 may comprise one or more dedicated hardware blocks arranged to generate specific sequences of addresses (e.g. a sequence using row-column mode for a particular arrangement of data items and a sequence using burst row-column mode for a particular arrangement of data items). In some examples the address generating element 210 may generate both linear and non-linear sequences and in other examples, a direct connection may be used for the linear sequences and the address generating element may be used to generate only the non-linear sequences.

By generating non-linear sequences of read and/or write addresses, the address generating element 210 can perform non-linear reordering of data items stored on a memory connected to one of the ports of the transfer engine 106 (e.g. on-chip memory 102 or DRAM 112). For example, FIG. 2 illustrates how a first sequence 212 of data items stored on the on-chip memory 102 can be reordered during a transfer to the DRAM 112. In the example of FIG. 2, there are eight data items on the on-chip memory 102, which are stored at memory addresses denoted 0 to 7. In other examples, the memory addresses can start from a base address other than zero, and/or each individual data item can be larger than a single memory location on the memory device. In this example, these data items are transferred to the DRAM 112, but are ordered in a second sequence 214 that is different to the first sequence 212. For clarity, the data items in the second sequence 214 are stored at memory addresses denoted 0' to 7' on the DRAM 112, although in other examples these addresses can start from a base address other than zero.

In a first example, the address generating element 210 can generate a non-linear read sequence of [3, 6, 4, 1, 2, 7, 0, 5] and provide this read sequence to the first memory port 202. The address generating element 210 can also generate a linear write sequence of [0', 1', 2', 3', 4', 5', 6', 7'] and provide this to the second memory port 204 (where the addresses on the DRAM 112 are denoted 0', 1' etc to distinguish them, for purposes of explanation only, from the addresses on the on-chip memory 102). This causes the first memory port 202 to firstly read the data item from the first address in the read sequence (address 3), which is data item "A" in this example. This data item is passed over the crossbar 208 to the second memory port 204, which writes this data item to the first memory address in the write sequence (address 0'). This results in data item "A" being reordered from being the fourth data item in the first sequence 212 to being the first data item in the second sequence 214. This operation repeats by reading the next address in the read sequence (address 6, address 4 etc) and writing the corresponding data item (B, C, . . . ) to the next address in the write sequence (address 1', address 2', . . . ). As a result of this, the data items from the first sequence (denoted G, D, E, A, C, H, B, F) are now stored on the DRAM in the second sequence (A, B, C, D, E, F, G, H).

In a second example, the same re-ordering of data items can also be achieved by the address generating element 210 generating a linear read sequence of [0, 1, 2, 3, 4, 5, 6, 7] and a non-linear write sequence of [6', 3', 4', 0', 2', 7', 1', 5']. In this example, data item "G" is first read from address 0 on the on-chip memory, and written to address 6' on the DRAM, followed by data item "D" read from address 1 on the on-chip memory, and written to address 3' on the DRAM, etc. Similarly, in a third example, the same re-ordering of data items can also be achieved by the address generating element 210 generating a non-linear read sequence and also a non-linear write sequence. One example of this would be a read sequence of [0, 2, 4, 6, 1, 3, 5, 7] and a write sequence of [6', 4', 2', 1', 3', 0', 7', 5'].

In each of the above examples, the re-ordering from the first to the second sequence is performed on-the-fly during the direct transfer of data items from the on-chip memory 102 to the DRAM 112 by the transfer engine 106. Similar operations may also be performed for transfers from the DRAM 112 to the on-chip memory 102, or from the on-chip memory to another location in the on-chip memory and similarly for transfer from DRAM to another address in DRAM.

The example above also showed the read and write address sequences being generated in full before performing the transfer. However, this generation of address sequences can also be performed concurrently with the transfer, for example by generating one or more read and write addresses as one or more previous data items are being read/written.

The process described above enables the data items on the on-chip memory 102 to be re-ordered into a different sequence as an integral part of a memory transfer operation to the DRAM 112 and similarly data items on the DRAM 112 can be re-ordered into a different sequence as part of a memory transfer operation to the on-chip memory 102. This can be used to implement interleaving or de-interleaving, e.g. by using an address generating element 210 which is arranged to generate the read/write address sequences according to an interleaving scheme.

Figure 3:
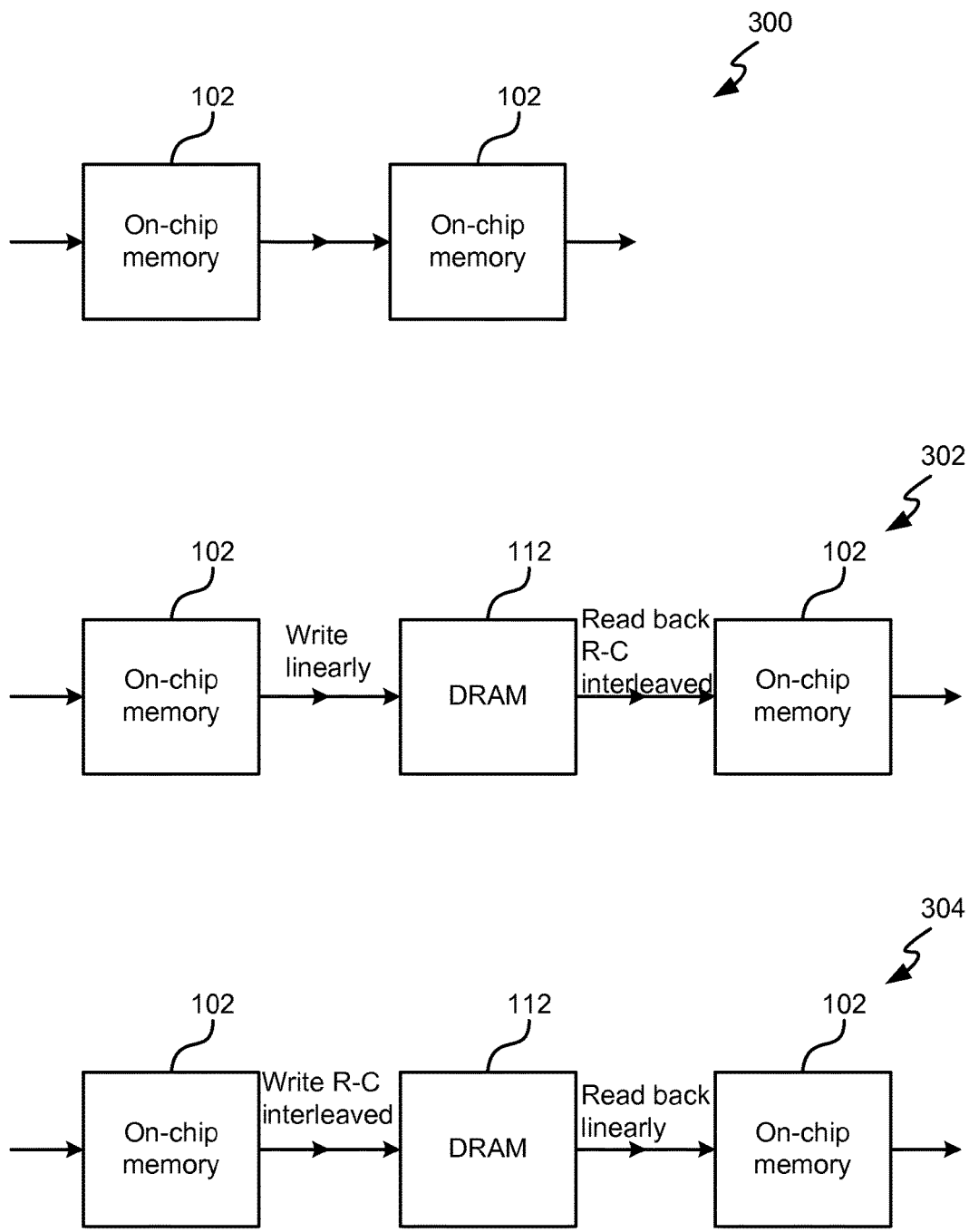
FIG. 3 shows schematic diagrams illustrating various example methods of de-interleaving.

FIG. 3 shows schematic diagrams illustrating various example methods of de-interleaving. In the first schematic diagram 300, the de-interleaving is performed in a single transfer from on-chip memory 102 to on-chip memory 102. In the subsequent two schematic diagrams 302, 304, there are two transfers: one transfer from the on-chip memory 102 to DRAM 112 and a second transfer from the DRAM back to the on-chip memory 102. In the second schematic diagram 302, de-interleaving of data items stored on the on-chip memory 102 may be performed by writing the data items to the DRAM 112 according to a linear write sequence and then reading them back from the DRAM 112 using a particular non-linear sequence which may be referred to as 'row-column mode' or 'row-column interleaved'. This non-linear sequence is described in detail below with reference to FIG. 4. Alternatively the de-interleaving of data items may be performed by writing data items to the DRAM 112 using row-column mode and then reading them back linearly, as shown in the third schematic diagram 304 in FIG. 3.

In all the implementations shown in FIG. 3 the de-interleaving process cannot start until all the interleaved data is in the input memory (i.e. the on-chip memory 102 shown on the left-hand-side of each of the diagrams in FIG. 3).

Figure 4:
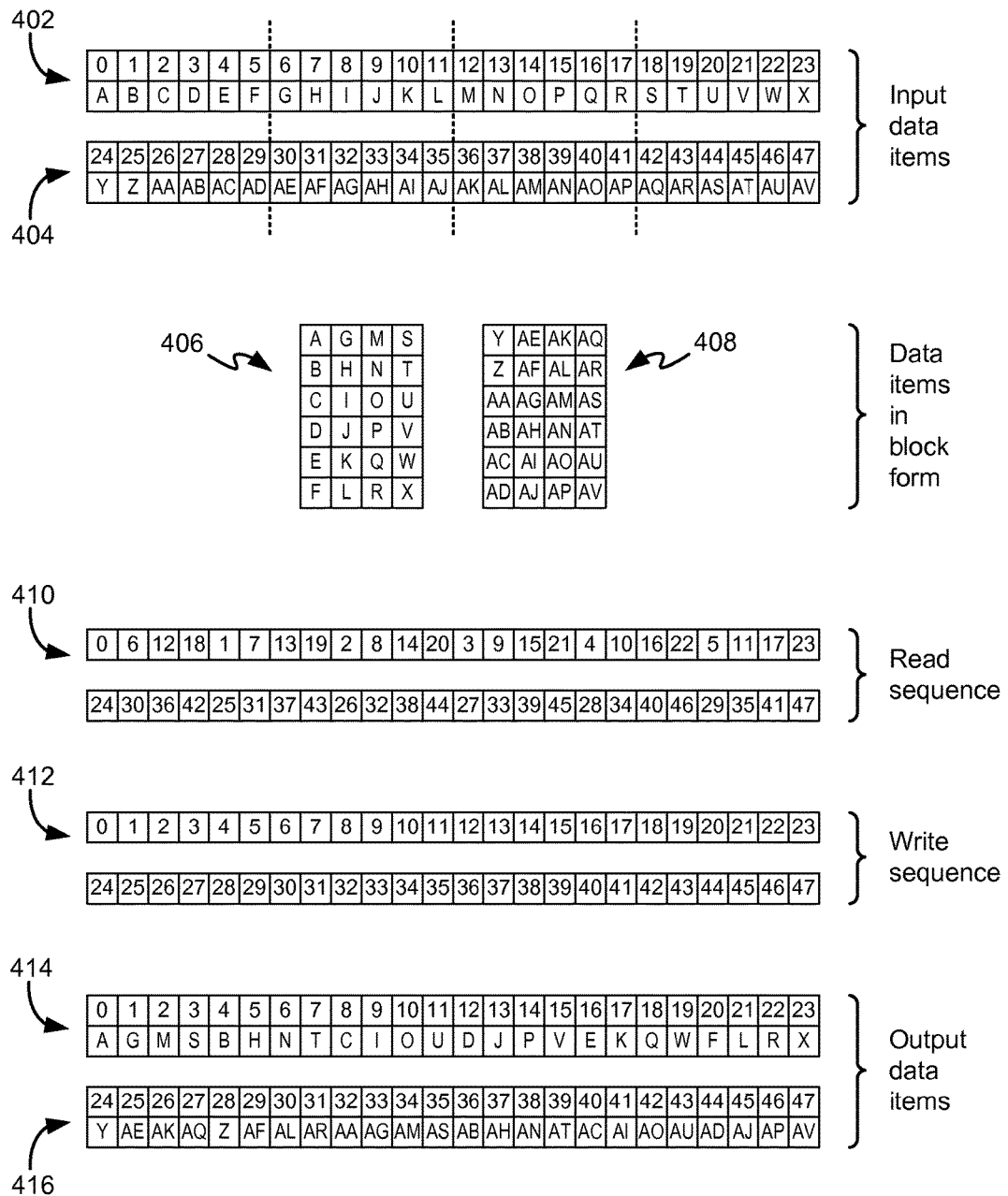
FIG. 4 illustrates an example of row-column operations performed on two blocks of data using the transfer engine.

Row-column mode considers the data items to be arranged in one or more grids or tables having a plurality of rows and columns. This is illustrated in FIG. 4, which shows a first block of input data items 402, which (for illustrative purposes only) have contiguous memory addresses from 0 to 23, and a second block of input data items 404 which (again for illustrative purposes only) have contiguous memory addresses from 24 to 47. If we are describing row-column mode with reference to the second example 302 in FIG. 3, these memory addresses are in the DRAM 112. In the example shown in FIG. 4, the data items are considered to have column breaks every six data items, as indicated by the dashed lines in FIG. 4. This means that the consecutive memory addresses are considered to be arranged along the columns of a grid having six rows (and this may be described as the data being written/read down the columns).

The data items presented in grid form are shown in FIG. 4, which shows a first grid 406 for the first block of input data items 402 and a second grid 408 for the second block of input data items 404. Both the first and second grids have six rows and four columns. It can be noted that consecutively addressed data items are arranged down the columns. However, in other examples, the data items can also be presented such that consecutive items are arranged along the rows instead, in which case the description below still applies but with references to rows and columns reversed.

The purpose of the row-column mode is to transpose each grid, such that when the input data items (e.g. from DRAM 112) are arranged in the sequence traversing the columns of the grid, the output data items (e.g. as output to the on-chip memory 102) are arranged in the sequence traversing the rows of the grid. For example, referring to grid 406, if the first four data items of the input data sequence are A, B, C, D (reading four items down the first column), then the first four data items of the output data sequence are A, G, M, S (reading four items along the first row). A row-column operation such as this therefore changes the order of data items in dependence on how many rows are defined as being present in the grid.

In order to implement the row-column mode, the address generating element 210 generates a read and a write sequence that results in the row-column transposition. This can be achieved by generating a non-linear read sequence (e.g. from the DRAM 112) and a linear write sequence (as illustrated in FIG. 4 and described in more detail below), or by generating a linear read sequence (e.g. from the on-chip memory 102) and a non-linear write sequence (e.g. as shown in third example 304 in FIG. 3). In further examples, non-linear read sequence and non-linear write sequences can also be used in order to enable efficient memory access as described below with reference to FIG. 6.

FIG. 4 shows the example of a non-linear read sequence 410, which can be seen to comprise non-consecutive memory addresses. In one example, the address sequence can be generated using an algorithm illustrated by the following pseudocode:

```
N0 = rows * columns;
N1 = rows;
N2 = numBlocks * rows * columns;
For ind = 1 to numItems
    nextItemAddr = a + o;
    a = a + N1;
    if a >= N0
        a = a - N0 + 1;
        b = b + 1;
        if b >= N1
            a = 0;
            b = 0;
            o = rem(o + N0, N2);
        end
    end
end
```

Where "rows" (N1) is the number of rows in the grid (six in the FIG. 4 example), "columns" is the number of columns in the grid (four in the FIG. 4 example), "numBlocks" is the number of blocks of data items (two in the FIG. 4 example), and "numItems" is the total number of data items over all blocks (48 in the FIG. 4 example). Variables "a", "b" and "o" are internal variables used within the algorithm that may be all initialised to zero or one or more may be initialized to non-zero values in order to apply an offset.

After calculating the initial values for N0 (the number of rows in the grid), N1 (the number of rows multiplied by the number of columns) and N2 (the product of the number of rows, the number of columns and the number of blocks of data items), the algorithm iterates through the number of data items present, calculating the next address in the sequence ("nextItemAddr") at each iteration. Effectively, the algorithm skips a fixed number of data items from the input sequence (e.g. six in FIG. 4) until the end of a row is reached (determined by the first if statement), and then increments the starting point for that row by one and repeats. The end of a block is detected by the second if statement, which resets the calculations but adds an offset calculated from the remainder operation, rem(•) (24 in FIG. 4). The process then repeats until "numItems" is reached. Note that "numItems" can be set to a value larger than the total number of data items present, and, if so, the algorithm wraps back to the first block once all the blocks have been accessed.

The read sequence 410 generated by the above algorithm is shown in FIG. 4, with the top row showing the sequence for the first block (grid 406) and the bottom row showing the sequence for the second block (grid 408). Taking the first four items of the read sequence 410 as an example, these read from addresses 0, 6, 12, 18, which correspond to data items A, G, M, S from the input data items 402. This can be seen to correspond to the first row of grid 406.

The address generating element 210 generates a linear write sequence 412 having consecutive memory addresses, such that when the read sequence 410 and write sequence 412 are used by the transfer engine 106 the data items are read in a non-linear sequence and written in a linear sequence. Note that the write sequence in FIG. 4 has addresses from 0 to 47 for simplicity, but in other examples the addresses can start from any base address. The result of the combination of the read sequence 410 and write sequence 412 can be seen in the first block of output data items 414 and the second block of output data items 416. By comparing these output data items to grid 406 and 408, it can be seen that a row-column operation has been successfully performed.

The same result can also be obtained by generating a linear read sequence and a non-linear write sequence (e.g. as in the second example 304 in FIG. 3), as follows (only the first block is shown for brevity):

Read Sequence:

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |

Write Sequence:

| 0 | 4 | 8 | 12 | 16 | 20 | 1 | 5 | 9 | 13 | 17 | 21 | 2 | 6 | 10 | 14 | 18 | 22 | 3 | 7 | 11 | 15 | 19 | 23 |

The non-linear write sequence can be generated using similar techniques to the non-linear read sequence described in detail above. The examples above illustrate how the address generating element 210 can be used to implement an interleaving/de-interleaving operation such as a row-column swap on a set of data items.

Figure 5:
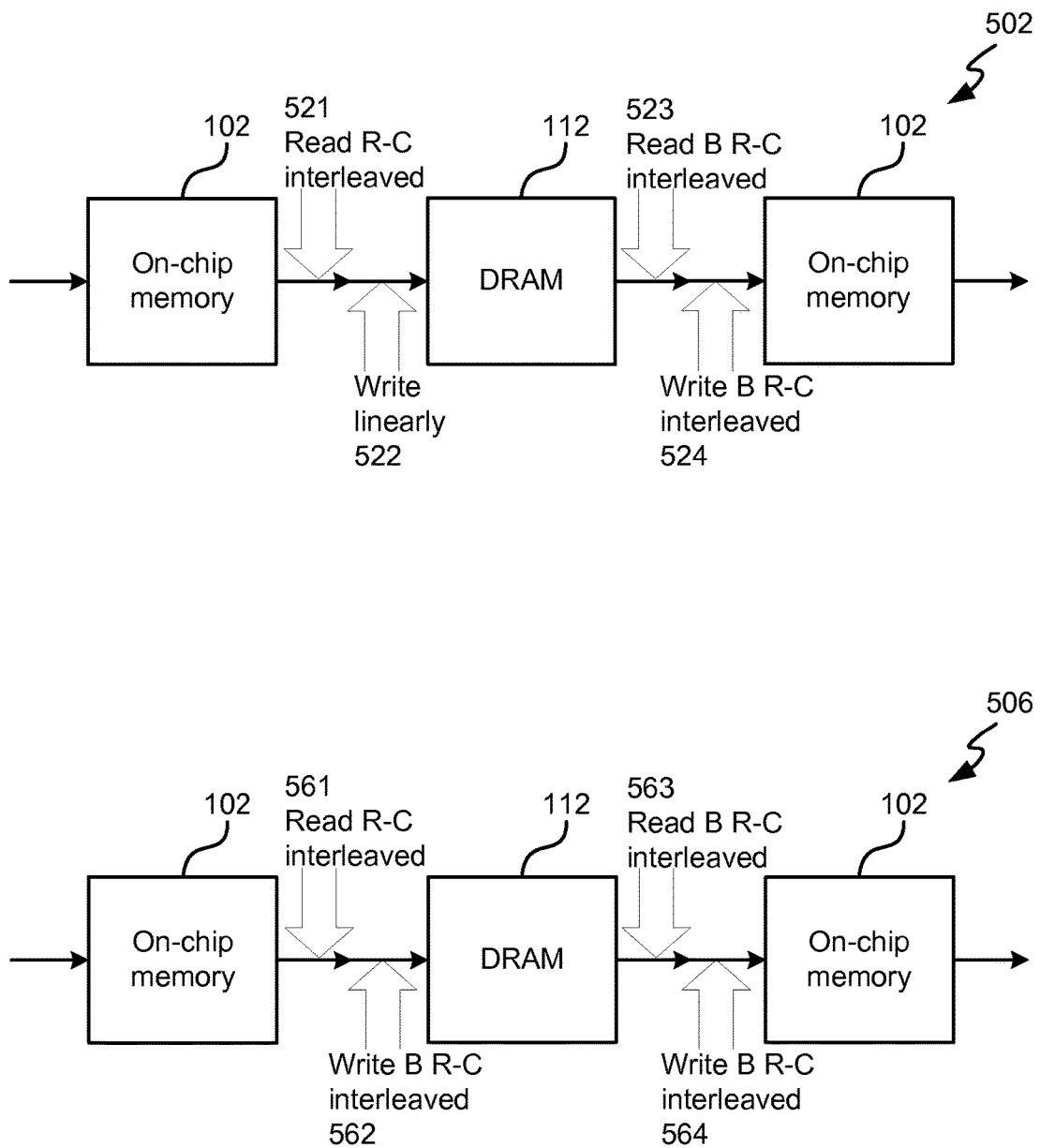
FIG. 5 shows schematic diagrams illustrating two further example methods of de-interleaving.

FIG. 5 shows schematic diagrams 502, 506 illustrating two further example methods of de-interleaving which are more efficient in the way that they interact with the DRAM 112. Both of these methods divide the time de-interleaving process into two memory-to-memory transfer operations (on-chip memory to DRAM and then DRAM to on-chip memory) each of which uses at least one non-linear sequence of addresses. Both of the methods also use a combination of row-column (R-C) mode (as described above with reference to FIG. 4, arrows 521 and 561) and burst row-column (B R-C) mode (arrows 523, 524 and 562-564).

Although FIG. 5 shows the data items being transferred from on-chip memory 102 to the DRAM 112 and then back to the on-chip memory 102, it will be appreciated that the data items may instead be written back to a separate on-chip memory from the on-chip memory where the data items were initially read from or the data items may be written back to a different part of the on-chip memory 102. In an example, the data items may be read (in the operations indicated by arrows 521 and 561) from a part of the on-chip memory 102 which may be referred to as a tiling buffer and the data items may subsequently be written back (in de-interleaved form) to a separate part of the on-chip memory 102 (in the operations indicated by arrows 524 and 564) which may be referred to as a de-interleaver output buffer. These two buffers may be of different sizes. In the following description, any reference to data items being transferred from and then back to the same on-chip memory 102 is by way of example only, and the methods described may also be used to transfer data items from one on-chip memory element to another (via the DRAM) or from one part of the on-chip memory 102 to another part of the on-chip memory 102 (via the DRAM).

Burst row-column mode may be considered a variant of the row-column mode described above, or alternatively, row-column mode may be considered a specific instance of burst row-column mode with a burst length of one. Burst row-column mode considers the data to be arranged in a grid having rows and columns (as described above); however, rather than just reading one data item from each column whilst traversing along the row (as in the row-column case) the burst row-column mode reads a predefined number of consecutive addresses (where this predefined number is referred to as the 'burst length', L) before skipping to the next column along the row (i.e. by skipping r-L data items, where r=number of rows in the grid). For example, referring to grid 406 of FIG. 4, if the burst length is three, then the burst row-column mode firstly reads three consecutive items in one burst (items A, B, C), then moves to the next column and reads the next three consecutive items (G, H, I), followed by M, N, O, and then S, T, U. It then wraps backs to the first column and reads D, E, F, followed by J, K, L, etc. The burst row-column mode can therefore be considered to be the same as the row-column mode, except that a group of consecutive data items are read, rather than just one, or alternatively, row-column mode may be considered to be burst row-column mode with a burst length equal to one.

A read sequence for the burst row-column mode can, in one example, be generated using an algorithm illustrated by the following pseudocode:

```
N1 = rows;
N3 = burstLength;
N4 = rows * columns - burstLength;
For ind = 1 to numItems
    nextItemAddr = a + o;
    a = a + 1;
    if a >= N3
        a = 0;
        o = o + N1;
        if o >= N4 + N1
            o = 0;
```

```
        elseif o >= N4 + N3
            o = o - N4;
        end
    end
end
```

The variables in this pseudocode are defined as set out above in the description of row-column mode. In addition, "burstLength" (N3) is the number of consecutive or contiguous items to read in each burst and N4 is the product of the number of rows (N1) and the number of columns minus N3. Note that write sequences for a burst row-column operation can also be generated in a similar manner.

The burst row-column mode can be used to enable de-interleaving operations to be performed efficiently with certain types of memory device, such as DRAM 112, particularly where the burst length (L) in B R-C mode is the same as or close to the DRAM interface burst size. By selecting a burst length (or burst size) based on a DRAM interface burst size in this way (or according to the other examples described below), this makes efficient use of the DRAM interface. In contrast, many conventional de-interleaver access patterns attempt to consecutively read/write widely spaced apart data items, leading to inefficient memory access with DRAM devices due to both incomplete (DRAM interface) bursts and the crossing of many DRAM pages.

For example, the row-column operation of FIG. 4 reads consecutive data items that are spaced apart by the number of rows in the grid. In examples where a large number of rows are present, this can result in accesses that are widely spaced apart across the memory device, resulting in inefficient accesses from different DRAM pages. Referring back to the examples shown in FIG. 3, it can be seen that in the second example 302, reading in row-column mode from the DRAM is inefficient and in the third example 304, writing in row-column mode to the DRAM is also inefficient.

Figure 6:
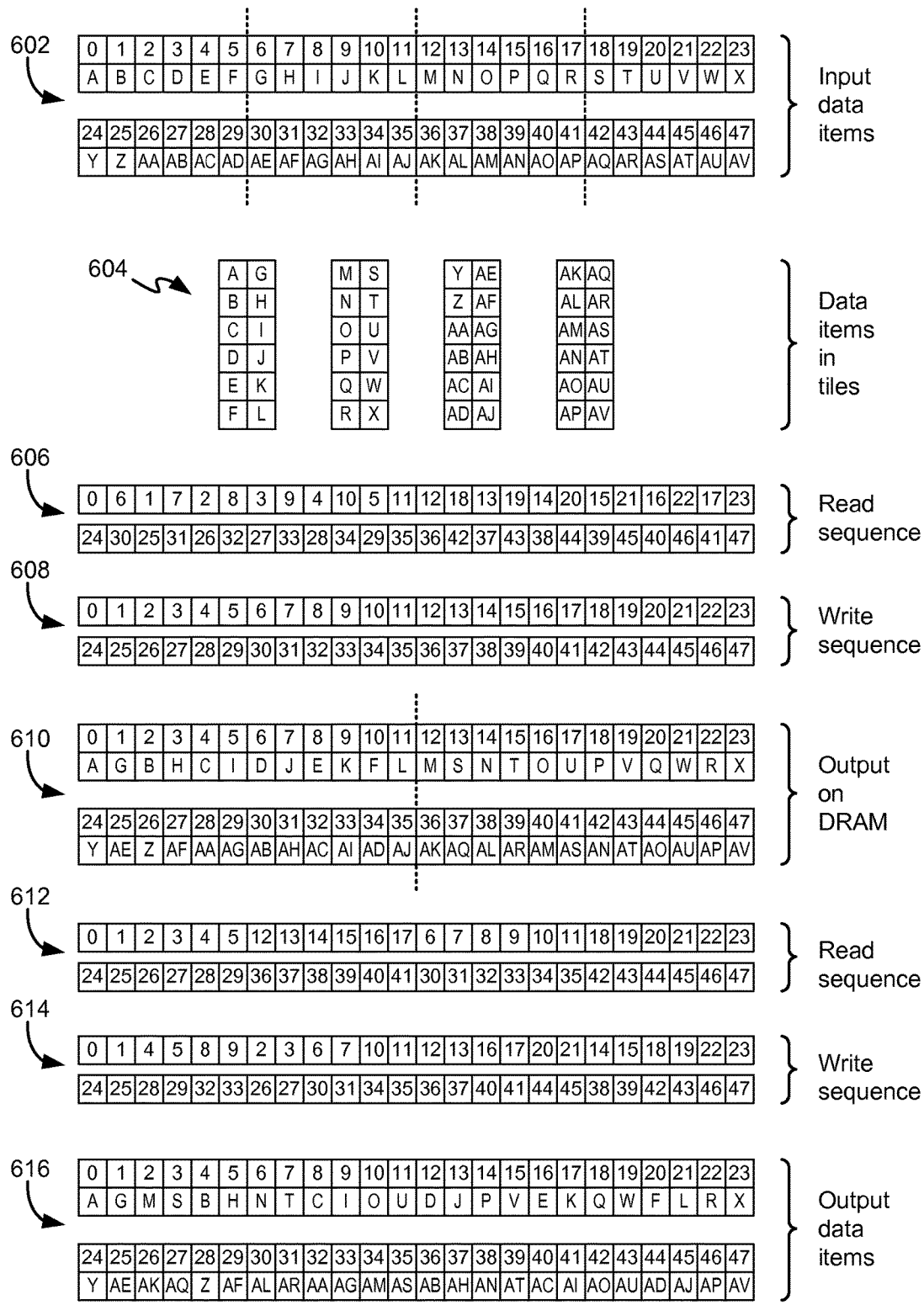
FIG. 6 illustrates an example of the row-column operation of FIG. 4 with enhancements to counteract the limitations of DRAM devices.

FIG. 6 illustrates an example of a de-interleaving operation which does not incur the inefficiencies of DRAM access associated with frequently accessing different pages or partially filling bursts. This example is also shown in the first schematic diagram 502 in FIG. 5. The example of FIG. 6 generates the same row-column result as that in FIG. 4 (i.e. a swap with six rows, four columns and two blocks), but does so using many runs of linear sequential memory accesses that result in efficient operation of a paged device like DRAM. In the example of FIG. 6, the transfer engine is reading a sequence of input data items from the on-chip memory 102, storing the data items on the DRAM 112 and then reading the data items back from the DRAM 112 and writing them to the on-chip memory 102 (potentially overwriting their original locations) with the rows and columns swapped.

For purposes of explanation, the input data items 602 are the same as those used in the example of FIG. 4. There are a total of 48 data items having a consecutive sequence of memory addresses starting from zero. Firstly, the data items are read from the on-chip memory 102 in row-column mode with six rows and two columns per block or tile. As shown in FIG. 6, the data items may be considered to be arranged in tiles 604 each having six rows and two columns. This size of tile is used herein by way of example only and in many implementations, the tile size may be set equal to the DRAM interface burst size. A non-linear read sequence 606 to read along the rows of each of these tiles in turn (i.e. using row-column mode) is generated by the address generating element 210 as described above. A linear write sequence 608 is also generated by the address generating element 210. The transfer engine 106 reads from the on-chip memory 102 using the non-linear read sequence 606 (arrow 521 in FIG. 5), and writes to the DRAM 112 using the linear write sequence 608 (arrow 522). The writing to DRAM in this manner is not inefficient, as it is writing linearly to contiguous addresses, and therefore will only occasionally cross a DRAM page boundary if the number of data items is sufficient.

As a result of this operation, the data items 610 on the DRAM 112 can be seen to correspond to a row-column swap from the tiles 604. A non-linear read sequence 612 is then generated by the address generating element 210 that reads these data items back from the DRAM 112. This read sequence is generated using the burst row-column mode, and is configured to avoid inefficient access. The burst row-column mode in this example uses six items per burst, twelve rows and two columns. Because the DRAM read sequence 612 reads bursts of data items, these are located at consecutive addresses on the DRAM, and hence are unlikely to cross page boundaries and will also make efficient use of the bursts available on the DRAM interface (especially if the address generator burst length, L, is close to the DRAM interface burst size). Therefore, significantly fewer page boundaries will be crossed relative to a (non-burst) row-column access.

A non-linear write sequence 614 is also generated to write the data items back to the on-chip memory 102. This write sequence 614 is also generated using the burst row-column mode, and in this example uses two items per burst, four rows and three columns. The combination of the read sequence 612 (arrow 523 in FIG. 5) and the write sequence 614 (arrow 524) is such that the output data items 616 written back to the on-chip memory 102 are in the same sequence as if a basic row-column operation with six rows, four columns and two blocks were performed (this can be compared to FIG. 4), except that the data was stored on a DRAM 112 without incurring inefficiencies due to page boundaries and incomplete bursts. Furthermore, because the initial read from the on-chip memory 102 (arrow 521 in FIG. 5) used a row-column operation with tiles of only two columns, this enables the transfer of data to the DRAM to begin as soon as one whole tile has arrived at the on-chip memory 102, which is sooner than if a four column block is used as in FIG. 4. This can improve performance in the case of real-time data, where the data is arriving in a stream over time.

FIGS. 7-10 illustrate an example of another de-interleaving operation which does not incur the inefficiencies of DRAM access associated with accessing different pages. This method is also shown in the second schematic diagram 506 in FIG. 5. As can be seen from FIG. 5, this method involves only linear interactions with the DRAM 112 within a burst, i.e. using burst row-column mode to both write to the DRAM (arrow 562) and read from the DRAM (arrow 563). As described above, this means that very few page boundaries will be crossed and DRAM interface bursts are used efficiently and this improves the overall efficiency of the method.

For illustrative purposes only this method considers the data items to be arranged in one or more grids or tables having a plurality of rows and columns (as in the previous examples) and further uses the concept of a tile which is formed from a set of data in the row-column structure. As described below, a tile may be sized according to the DRAM interface burst or page size. It will be appreciated that the data in memory is stored in contiguous memory locations.

Figure 7:
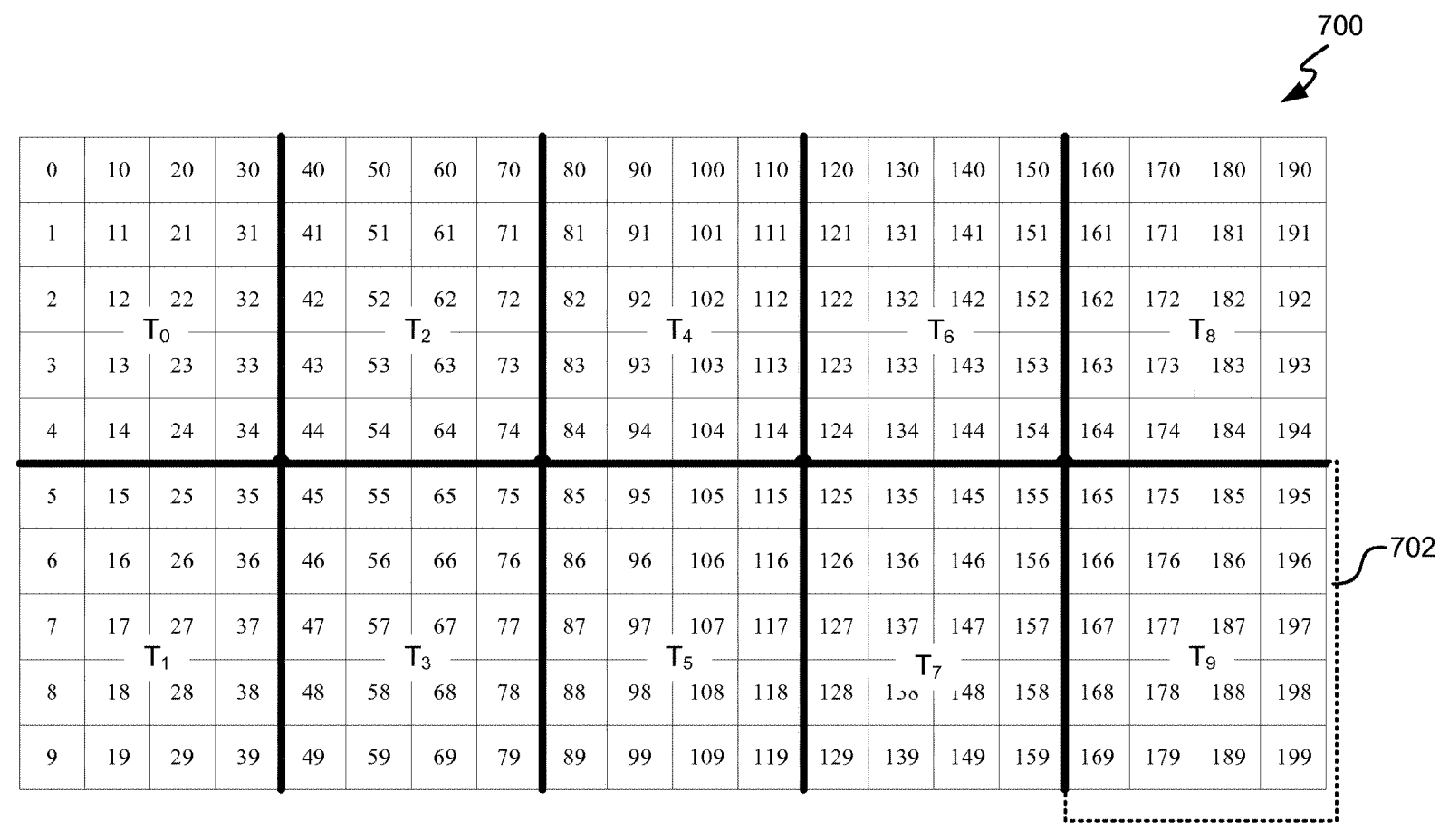

FIG. 7 shows an example time interleaved block of data 700 comprising 200 data items (addresses 0-199 are labelled) arranged in 10 tiles 702 ($T_0$-$T_9$), each comprising 20 items. Where the DRAM 112 is a burst mode accessed DRAM, the tile size may be selected to match the DRAM interface burst size and this further improves the efficiency of the method, as the memory transfer (as described below) makes efficient use of the DRAM interface. If the tile size does not match the DRAM interface burst size, the tile size may alternatively be smaller than the DRAM interface burst size or there may be multiple bursts per tile. In many examples, where the tile size does not match the DRAM interface burst size exactly, the tiles are aligned to page boundaries in the DRAM and this may provide significant improvements in the DRAM interface efficiency. As described in more detail below, the choice of tile size places constraints on the size of the on-chip RAM tiling buffer (i.e. the on-chip memory 102 from which data is read) because the method cannot start until at least one entire tile is stored in the tiling buffer.

It will be appreciated that although the example time interleaved block 700 in FIG. 7 comprises 200 data items, these blocks may be significantly larger than this and may comprise thousands of data items. Furthermore, the arrangement of rows and columns within the time interleaved block may be set by the system in which the method is used.

The de-interleaving process in this example is divided into several stages of memory-to-memory transfer, with each transfer (or 'tiling job') transferring a number of tiles, as can be explained with reference to the flow diagram shown in FIG. 8. The method shown in FIG. 8 transfers N tiles in each tiling job and the value of N may be selected to be equal to a column of tiles (e.g. N=2 in the example shown in FIG. 7). In other examples, however, a tiling job may comprise a number of columns of tiles (e.g. more than one column) in order to reduce the number of tiling jobs required. For the purposes of explanation only, the method shown in FIG. 8 will be described with reference to the time interleaved block of data 700 shown in FIG. 7 and with N=2. In those examples where a tiling job comprises more than one column of tiles, the method operates as described below and only the configuration of the address generator is changed (i.e. this tells the address generator to process more data).

The method can start once a minimum of N tiles (i.e. at least N tiles) from the time interleaved block are stored in the on-chip memory 102 (block 802), e.g. once tiles $T_0$ and $T_1$ are stored in the on-chip memory 102. As described above, the part of the on-chip memory 102 in which these interleaved tiles $T_0$ and $T_1$ are stored may be referred to as a tiling buffer and as the first stage 81 of the memory-to-memory transfer operates on N tiles, this tiling buffer may only be sized to be able to store N tiles of data. In an example, the tiling buffer may be an elasticity buffer that can be sized in a way to allow for one or more tiling jobs depending on the system throughput, the available memory bandwidth and the DRAM interface.

The first tile, $T_0$, is read using row-column mode from the on-chip memory 102 (block 804 and arrow 561 in FIG. 5). The non-linear read sequence for this first tile which is used is therefore:

| 0 | 10 | 20 | 30 | 1 | 11 | 21 | 31 | 2 | 12 | 22 | 32 | 3 | 13 | 23 | 33 | 4 | 14 | 24 | 34 | where the numbers above correspond to the addresses of the data items in the on-chip memory, as shown in FIG. 7.

Referring back to the earlier description of row-column mode (and in particular the pseudocode example provided), it can be seen that a data item (i.e. one data item) is read and then the next 9 data items are skipped before another data item is read. This is repeated until 4 data items in total have been read (the number of columns in a tile) and then the whole process is repeated with an offset of one data item (i.e. address 1 is read followed by 11), and so on until the whole tile has been read.

This sequence of data items is then written using burst row-column mode to the DRAM 112 (block 806 and arrow 562) with a burst length, L, equal to the number of data elements in a tile (e.g. L=20):

| 0' | 1' | 2' | 3' | 4' | 5' | 6' | 7' | 8' | 9' | 10' | 11' | 12' | 13' | 14' | 15' | 16' | 17' | 18' | 19' |
|----|----|----|----|----|----|----|----|----|----|-----|-----|-----|-----|-----|-----|-----|-----|-----|-----|
| 0  | 10 | 20 | 30 | 1  | 11 | 21 | 31 | 2  | 12 | 22  | 32  | 3   | 13  | 23  | 33  | 4   | 14  | 24  | 34  | where the first row corresponds to the addresses of the data items in the DRAM, labelled 0'-19' to distinguish them from the original addresses in the on-chip memory 102 from which the data items were read, which are shown in the second row.

These two operations (the read operation in block 804 and the write operation in block 806) are then repeated until all N tiles have been written to the DRAM ('Yes' in block 808). At this stage, having written N tiles to the DRAM, all the stored data items may have been read from the on-chip memory 102 and in which case the on-chip memory may be refilled with a further N tiles of data items from the time interleaved block (block 810). Alternatively, where there are already further tiles stored in the on-chip memory (e.g. at least N further tiles), the method may continue to read additional tiles (in block 804) and write them to the DRAM (in block 806) without requiring refilling of the on-chip memory (i.e. block 810 is omitted).

This first stage 81 is repeated until the entire time interleaved block 700 has been read from the on-chip memory 102 and written to the DRAM ('Yes' in block 812), with the on-chip memory 102 being refilled (in block 810) where appropriate. In this example, there will be five transfers, each transferring two tiles (as N=2 and the block 700 comprises 10 tiles).

FIG. 9 shows a grid representation 902 of the data items (referenced by the original address location in block 700) stored in the DRAM at the end of the first stage 81 for an input time interleaved block 700 as shown in FIG. 7. Alongside this grid 902 is a second grid 904 which identifies the addresses of each data item in the DRAM 122 (labelled 0'-199' to distinguish them from the original addresses 0-199 in the on-chip memory 102). In this grid representation, the original tiles are re-ordered (compared to block 700), although not de-interleaved, and the re-ordered data items from a tile occupy consecutive memory addresses (e.g. $T_0$ is stored in addresses 0'-19'). As can be seen from FIG. 9, the grid comprises 40 rows and 5 columns, such that each column of data items (where consecutive data items are arranged in columns) comprises two tiles. The boundary between the tiles in a column is marked by a dotted line 906.

In the second stage 82 of the method, the data items are transferred back to the on-chip memory 102 (or to another on-chip memory element, as described above) and a further re-ordering operation is used to complete the de-interleaving of the data. The first tile, $T_0$, is read from the DRAM 112 (block 814 and arrow 563 in FIG. 5) using burst row-column mode with a burst length, L, which is again equal to the number of data elements in a tile (L=20 in this example), i.e. the read sequence is:

| 0' | 1' | 2' | 3' | 4' | 5' | 6' | 7' | 8' | 9' | 10' | 11' | 12' | 13' | 14' | 15' | 16' | 17' | 18' | 19' |
|----|----|----|----|----|----|----|----|----|----|-----|-----|-----|-----|-----|-----|-----|-----|-----|-----|
| 0  | 10 | 20 | 30 | 1  | 11 | 21 | 31 | 2  | 12 | 22  | 32  | 3   | 13  | 23  | 33  | 4   | 14  | 24  | 34  | where the first row corresponds to the addresses of the data items in the DRAM 112 and the second row shows the original addresses in the on-chip memory 102 from which the data items were read.

The tile, $T_0$, is then written using burst row-column mode to the on-chip memory 102 (block 816 and arrow 564). The burst row-column mode uses a burst length, L, which is equal to the number of columns in a tile in the original time interleaved block 700, e.g. four in the example shown in FIG. 7. Data is therefore written to four consecutive addresses in the on-chip memory, the next 16 addresses (number of columns in the original time interleaved block=number of rows in the transposed block=20, 20−4=16) are skipped and then data is written to the next four consecutive addresses and so on. The non-linear write sequence is therefore:

| 0″ | 1″ | 2″ | 3″ | 20″ | 21″ | 22″ | 23″ | 40″ | 41″ | 42″ | 43″ | 60″ | ... | 80″ | 81″ | 82″ | 83″ |
|----|----|----|----|-----|-----|-----|-----|-----|-----|-----|-----|-----|-----|-----|-----|-----|-----|
| 0  | 10 | 20 | 30 | 1   | 11  | 21  | 31  | 2   | 12  | 22  | 32  | 3   | ... | 4   | 14  | 24  | 34  | where the first row corresponds to the addresses in the on-chip memory to which writes are directed, labelled 0″, 1″, etc to distinguish them from the original addresses in the on-chip memory 102 from which the data items were read in the first stage 81 and these original addresses are shown in the second row.

It should be noted that the burst length used in the first two burst row-column operations (arrows 562 and 563) which write to and read from the DRAM use the same burst length (e.g. L=20) and this third burst row-column operation (arrow 564) which writes to the on-chip memory uses a different burst length (e.g. L=4).

This second stage 82 is then repeated, tile by tile (and using the same tile size as the first stage 81), until all the tiles have been written to the on-chip memory 102 ('Yes' in block 818).

Figure 10:
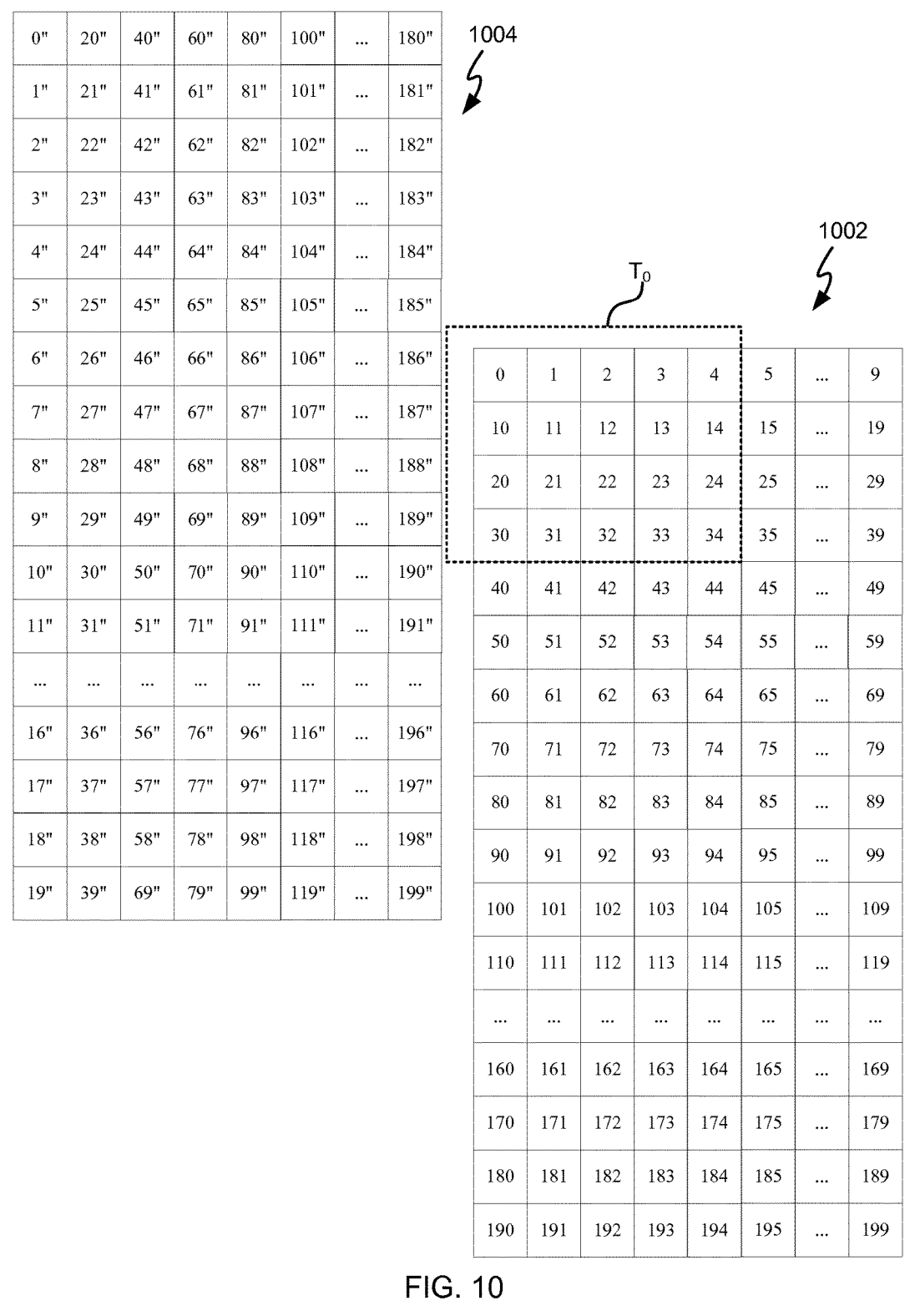

FIG. 10 shows a grid representation 1002 of the data items (referenced by the original address location in block 700) stored in the on-chip memory at the end of the second stage 82 for an input time interleaved block 700 as shown in FIG. 7. Alongside this grid 1002 is a second grid 1004 which identifies the addresses of each data item in the on-chip memory 102 (labelled 0"-199" to distinguish them from the original addresses 0-199 in the on-chip memory 102 and the addresses 0'-199' in the DRAM 112). In this grid representation, the original data items are de-interleaved, as can be seen from FIG. 10, such that the first tile $T_0$ now comprises four rows and five columns (instead of five rows and four columns, as in block 700), as shown by a dotted outline. As can be seen from FIG. 10, the grid for one de-interleaved block comprises 20 rows and 10 columns.

It will be appreciated that although FIGS. 7, 9 and 10 show addresses starting from a base address of 0, in other examples, the addresses may start from any base address.

Figure 8:
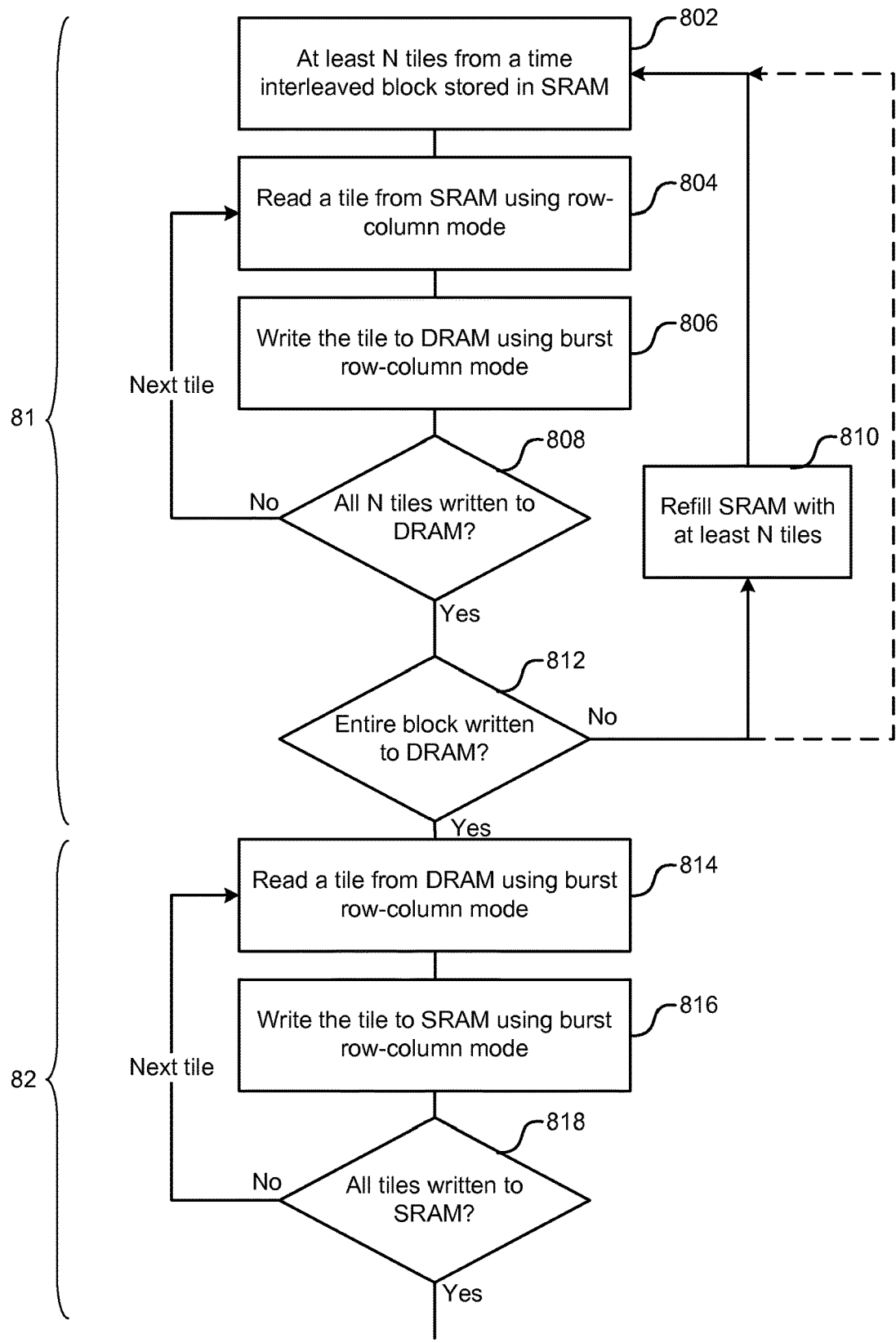
FIG. 8 is a flow diagram of an example method of de-interleaving.

It can be seen from the above explanation and FIG. 8, that read/write jobs in the method may operate on a number of tiles (e.g. one or more tiles) and not the whole time interleaved block. This enables the method to be optimized for the particular DRAM interface burst size, e.g. a tile can be set up to be the same size as one DRAM interface burst and a tiling job will then be an integer number of DRAM interface bursts (e.g. two in the example described above with reference to FIGS. 7, 9 and 10). The DRAM interface burst size, which is defined by the DRAM interface, may be set at the page or sub-page level within the DRAM and will depend upon the bus bandwidth and may be set such that the start of a burst is aligned with the start of a page and where possible fully completes within a page (to prevent inefficiencies due to memory paging). As described above, where the tile size does not exactly match the DRAM interface burst size or be a multiple of the DRAM interface burst size, the tiles may instead be aligned to page boundaries in order to improve the DRAM efficiency at a cost of unused DRAM capacity.

Although the description above and FIG. 8 show the method being performed in series, (i.e. the second stage 82 is performed after the first stage 81 has been completed), aspects of the method may be performed in parallel such that tiles from one time interleaved block may be being read from the SRAM and written to the DRAM (in the first stage 81) and at the same time tiles from another time interleaved block may be being read from the DRAM and written to the SRAM (in the second stage 82). This allows memory re-use because the operation of writing to the DRAM (block 806) may use the same set of addresses as are being read from in the second stage 82 (block 814), as long as the timing is such that a particular address is read (in block 814) before it is over-written (in block 806) with data items from another time interleaved block.

The method shown in FIG. 8 and described above divides the operation of transposing the grid of data items (in order to perform de-interleaving) into two separate parts. A first part of the transposition is performed when reading from the SRAM (block 804 and arrow 561 in FIG. 5) and writing to the DRAM (block 806 and arrow 562) and the second part of the transposition is performed when reading from the DRAM (block 814 and arrow 563) and writing back to the SRAM (block 816 and arrow 564). All these transpositions use non-linear sequences of addresses; however, different non-linear sequences are used. In the first part, row-column mode is used for the read from SRAM (burst length=1) and in the second part, burst row-column mode is used to write to the SRAM (burst length=number of columns in a tile). The interactions with the DRAM (writing in block 806 and reading in block 814) use burst row-column mode with a burst length which is equal to the number of data elements in a tile (e.g. L=20 in the example shown in FIGS. 7-10).

The methods described above with reference to FIGS. 5 (example 506) and 7-10 use the available DRAM (and in particular burst accessed DRAM) bandwidth efficiently because of the use of a multi-stage process involving transfer of tiles of data (instead of the entire time interleaved block), where the tile size is selected according to the DRAM interface burst size. The arrangement of tiles is specific to a particular implementation and the methods described above may be applied to any arrangement of tiles and any number of data items per tile.

For example, where the method is used in DVB-T2, the number of tiles in a column (N) may be set equal to the number of Forward Error Correction (FEC) blocks, such that the examples shown in FIGS. 7-10 may correspond to a scenario where there are two FEC blocks. In other examples there may be three FEC blocks so N=3 and three tiles will be transferred from the SRAM to the DRAM in a tiling job and written to consecutive addresses in the DRAM.

The methods described above, the de-interleaving process is divided into several stages. Using the methods described, it is not necessary to store the entire interleaved block of data in the tiling buffer before the de-interleaving process can start. As described with reference to FIG. 8, it is only necessary to have N tiles stored in the tiling buffer before the method starts.

The methods described above with reference to FIGS. 5 (example 506) and 7-10 may be implemented using an address generating element 210 as shown in FIG. 2. This address generating element 210 may be configurable or may comprise specific hardware logic arranged to generate the required (pre-defined) non-linear address sequences which are used in a particular implementation of the method (e.g. for a particular arrangement of tiles).

The methods described above may be used for de-interleaving any interleaved block of data. Example applications include OFDM signals and in particular Digital Terrestrial Television (DTT) signals such as DVB-T2; however, the methods are not limited to OFDM, DTT or DVB-T2. The methods described above may also be used for interleaving data to form an interleaved block of data. To use the methods described above for interleaving, rather than de-interleaving, the method steps remain the same and the difference is that the input data (e.g. as stored in block 802) comprises de-interleaved data (and not interleaved data) and the output data (e.g. as written back to the SRAM at the end of FIG. 8) comprises interleaved data (and not de-interleaved data).

The term "processor" and "computer" is used herein to refer to any device with processing capability such that it can execute instructions. Those skilled in the art will realize that such processing capabilities are incorporated into many different devices and therefore the term "computer" includes set top boxes, media players, digital radios, PCs, servers, mobile telephones, personal digital assistants and many other devices.

Those skilled in the art will realize that storage devices utilized to store program instructions or data can be distributed across a network. For example, a remote computer may store an example of a process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, programmable logic array, or the like.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term "comprising" is used herein to mean including the method blocks or elements identified, but that such blocks or elements do not comprise an exclusive list and an apparatus may contain additional blocks or elements and a method may contain additional operations or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of the examples.

The invention claimed is:

1. A digital signal processing system-on-chip, comprising:
a first memory storing a plurality of data items arranged in a first sequence, each data item having an associated memory address on the first memory;
a second memory; and
a transfer engine coupled to the first memory and the second memory and comprising a port to a dynamic random access memory (DRAM) wherein the transfer engine is configured to transfer the plurality of data items directly from the first memory to the DRAM in a first memory transfer stage and to transfer the plurality of data items directly from the DRAM to the second memory in a second memory transfer stage,
wherein in the first memory transfer stage, the transfer engine is arranged to read the plurality of data items from the first memory according to a predefined non-linear sequence of memory read addresses and to write the plurality of data items to the DRAM, and
wherein in the second memory transfer stage, the transfer engine is arranged to read the plurality of data items from the DRAM according to bursts of linear address sequences, each burst of linear address sequences having a length selected based on a DRAM interface burst size, and to write the plurality of data items to the second memory according to a predefined non-linear sequence of memory write addresses, such that the plurality of data items are arranged in a second sequence on the second memory that is different from the first sequence and wherein one of the first sequence and the second sequence comprises row-column interleaved data and wherein the second sequence is either row-column interleaved or de-interleaved with respect to the first sequence.

2. A digital signal processing system-on-chip according to claim 1, wherein the first memory and the second memory are both static random access memory.

3. A digital signal processing system-on-chip according to claim 1, wherein the first memory and the second memory are the same on-chip memory.

4. A digital signal processing system-on-chip according to claim 1, further comprising the DRAM.

5. A digital signal processing system-on-chip according to claim 1, wherein the plurality of data items comprises a subset of a block of data items and the transfer engine is further arranged to repeat the first and second memory transfer stages until all the block of data items has been written to the second memory.

6. A digital signal processing system-on-chip according to claim 1, further comprising at least one address generating element arranged to generate the predefined non-linear sequence of memory read addresses and the predefined non-linear sequence of memory write addresses.

7. A digital signal processing system-on-chip according to claim 1, wherein the plurality of data items comprises a subset of a block of data items and the block of data items is defined as being arranged as a grid comprising a number of rows of data items and a number of columns of data items.

8. A digital signal processing system-on-chip according to claim 7, wherein the grid further comprises a plurality of tiles, each tile comprising a rectangular portion of the grid and further comprising R rows and C columns of data items and wherein the plurality of data items comprises one or more tiles.

9. A digital signal processing system-on-chip according to claim 8, wherein the predefined non-linear sequence of memory read addresses comprises, for each tile in the first plurality of data items: a sequence of non-consecutive memory addresses separated by a fixed number of memory addresses and starting at an initial starting address, the fixed number corresponding to one less than the number of rows in the grid, until a boundary of the tile is reached, followed by one or more additional sequences of non-consecutive memory addresses, each additional sequence starting at an offset initial starting address.

10. A digital signal processing system-on-chip according to claim 8, wherein the predefined non-linear sequence of memory write addresses comprises: a sequence of groups of C consecutive memory addresses separated by a fixed number of memory addresses in the second memory and starting at an initial starting address in the second memory, the fixed number corresponding to C less than the number of columns in the grid.

11. A digital signal processing system-on-chip according to claim 8, wherein the plurality of data items comprises a tile of the grid.

12. A digital signal processing system-on-chip according to claim 8, wherein in the second memory transfer stage, the bursts of linear address sequences comprises a sequence of bursts of X consecutive memory addresses separated by a fixed number of memory addresses in the second memory and starting at an initial starting address in the second memory, where X is equal to the number of data items in a tile of the grid.

13. A digital signal processing system-on-chip according to claim 8, wherein in the first memory transfer stage, the transfer engine is arranged to write the plurality of data items to the DRAM according to bursts of linear address sequences, each burst of linear address sequences having a length selected based on a DRAM interface burst size.

14. A digital signal processing system-on-chip according to claim 13, wherein in the first memory transfer stage, the bursts of linear address sequences comprises a sequence of bursts of X consecutive memory addresses separated by a fixed number of memory addresses in the second memory and starting at an initial starting address in the second memory, where X is equal to the number of data items in a tile of the grid.

15. A digital signal processing system-on-chip according to claim 8, wherein a tile is sized based on a size of the DRAM interface burst.

16. A method of performing an interleaving or de-interleaving operation on data items in a digital signal processing system, the method comprising:
    reading, from a first on-chip memory, a first plurality of data items stored in a first sequence according to a predefined non-linear sequence of memory read addresses;
    writing the first plurality of data items to a dynamic random access memory (DRAM);
    reading, from the DRAM, the first plurality of data items according to bursts of linear address sequences, each burst of linear address sequences having a length selected based on a DRAM interface burst size; and
    writing the first plurality of data items to a second on-chip memory according to a predefined non-linear sequence of memory write addresses, such that the data items are arranged in a second sequence on the second on-chip memory that is different from the first sequence and wherein one of the first sequence and the second sequence comprises row-column interleaved data and wherein the second sequence is either row-column interleaved or de-interleaved with respect to the first sequence.

17. A method according to claim 16, wherein the first plurality of data items comprises a subset of a block of data items, wherein the block of data items is defined as being arranged as a grid comprising a number of rows of data items and a number of columns of data items, the grid further comprising a plurality of tiles, each tile comprising a rectangular portion of the grid and further comprising R rows and C columns of data items and wherein the first plurality of data items comprises one or more tiles, and wherein reading, from a first on-chip memory, a first plurality of data items stored in a first sequence according to a predefined non-linear sequence of memory read addresses comprises, for each tile in the first plurality of data items:
    (i) reading a data item at an initial starting address in the first on-chip memory;
    (ii) skipping a fixed number of data items, the fixed number corresponding to one less than the number of rows in the grid;
    (iii) reading a data item; (iv) repeating steps (ii) and (iii) until a boundary of the tile is reached;
    (v) adding an offset to the initial starting address; and
    (vi) repeating steps (i)-(v) until each data item in the tile has been read.

18. A method according to claim 16, wherein the first plurality of data items comprises a subset of a block of data items, wherein the block of data items is defined as being arranged as a grid comprising a number of rows of data items and a number of columns of data items, the grid further comprising a plurality of tiles, each tile comprising a rectangular portion of the grid and further comprising R rows and C columns of data items and wherein the first plurality of data items comprises one or more tiles, and wherein writing the first plurality of data items to a second on-chip memory according to a predefined non-linear sequence of memory write addresses comprises:
    (i) writing C data items from the first plurality of data items to a plurality of consecutive addresses in the second on-chip memory, starting at an initial starting address in the second on-chip memory for the tile;
    (ii) skipping a fixed number of addresses in the second on-chip memory, the fixed number corresponding to C less than the number of columns in the grid;
    (iii) writing C data items from the first plurality of data items to a plurality of consecutive addresses in the second on-chip memory; and
    (iv) repeating steps (ii) and (iii).

19. A method according to claim 16, wherein the first plurality of data items comprises a subset of a block of data items, wherein the block of data items is defined as being arranged as a grid comprising a number of rows of data items and a number of columns of data items, the grid further comprising a plurality of tiles, each tile comprising a rectangular portion of the grid and further comprising R rows and C columns of data items and wherein the first plurality of data items comprises one or more tiles, and wherein writing the first plurality of data items to the DRAM comprises:
    (i) writing X data items from the first plurality of data items to a plurality of consecutive addresses in the DRAM, starting at an initial starting address in the DRAM for the tile;
    (ii) skipping a fixed number of addresses in the DRAM;

(iii) writing X data items from the first plurality of data items to a plurality of consecutive addresses in the DRAM; and
(iv) repeating steps (ii) and (iii), wherein X is equal to the number of data items in a tile of the grid.

20. A method according to claim 16, wherein the first plurality of data items comprises a subset of a block of data items, wherein the block of data items is defined as being arranged as a grid comprising a number of rows of data items and a number of columns of data items, the grid further comprising a plurality of tiles, each tile comprising a rectangular portion of the grid and further comprising R rows and C columns of data items and wherein the first plurality of data items comprises one or more tiles, and wherein reading the first plurality of data items from the DRAM according to bursts of linear address sequences comprises:
  (i) reading X data items from the first plurality of data items from a plurality of consecutive addresses in the DRAM, starting at an initial starting address in the DRAM;
  (ii) skipping a fixed number of addresses in the DRAM;
  (iii) reading X data items from the first plurality of data items from a plurality of consecutive addresses in the DRAM; and
  (iv) repeating steps (ii) and (iii), wherein X is equal to the number of data items in a tile of the grid.

* * * * *